United States Patent [19]
Crowley et al.

[11] Patent Number: 5,493,225
[45] Date of Patent: Feb. 20, 1996

[54] METHOD FOR MAINTAINING ENCODED COHERENCE FOR REMOTELY POSITIONED MRI DEVICE

[75] Inventors: Christopher W. Crowley, San Diego; Freeman H. Rose, Jr., Del Mar, both of Calif.

[73] Assignee: Panacea Medical Laboratories, Carlsbad, Calif.

[21] Appl. No.: 168,771

[22] Filed: Dec. 14, 1993

[51] Int. Cl.$^6$ .................................................... G01V 3/14
[52] U.S. Cl. ............................................ 324/309; 324/307
[58] Field of Search ...................................... 324/309, 307

[56] References Cited

U.S. PATENT DOCUMENTS

| | | |
|---|---|---|
| 4,689,567 | 8/1987 | Maudsley . |
| 4,893,081 | 1/1990 | Zur . |
| 5,099,208 | 3/1992 | Fitzpatrick . |
| 5,229,717 | 7/1993 | Hinks . |
| 5,260,656 | 11/1993 | Cory ........................................ 324/309 |
| 5,280,244 | 1/1994 | Hinks .................. 324/309 X |
| 5,304,930 | 4/1994 | Crowley . |
| 5,347,216 | 9/1994 | Foo ........................................ 324/309 |

FOREIGN PATENT DOCUMENTS

| | | |
|---|---|---|
| 0399789 | 11/1990 | European Pat. Off. . |
| 0515197 | 11/1992 | European Pat. Off. . |
| 0526983 | 2/1993 | European Pat. Off. . |

Primary Examiner—Louis M. Arana
Assistant Examiner—Mack Haynes
Attorney, Agent, or Firm—Nydegger & Associates

[57] ABSTRACT

A method for using a remotely positioned MRI device to image a material with an inhomogeneous magnetic field requires maintaining an encoded coherence of all components of nuclear magnetization in the material during the imaging process. To do this, the encoding of nuclei is accomplished first, and then the nuclei are repetitively refocussed to obtain recordable net magnetic moments. This is repeated as part of a two-step recording sequence wherein first one component of the refocused nuclear magnetization is recorded and then the other component of the refocussed nuclear magnetization is recorded. Importantly, for each step in the recording sequence the encoding and the repetitive refocussing of the nuclei are accomplish separately. Specifically the method includes the steps of: tilting the nuclei with a 90° pulse; encoding the nuclei with a gradient; pulsing the encoded nuclei with a train of 180° pulses having a first phase angle to generate a pattern of magnetic moments; and recording the pattern. All of this is then repeated using 180° pulses with a different phase angle. The method also contemplates combining a plurality of patterns to create an image of the material.

25 Claims, 2 Drawing Sheets

METHOD FOR MAINTAINING ENCODED COHERENCE FOR REMOTELY POSITIONED MRI DEVICE

FIELD OF THE INVENTION

The present invention pertains generally to magnetic resonance imaging (MRI). More specifically, the present invention pertains to remotely positionable MRI devices which use an inhomogeneous magnetic field for imaging a slice or plane of material inside an object. The present invention is particularly, but not exclusively, useful for the imaging of biological tissue.

BACKGROUND OF THE INVENTION

Nuclear Magnetic Resonance Imaging (MRI) is a well known diagnostic procedure which is extensively used in the medical field to noninvasively image internal biological tissue. As is also well known, MRI relies on the nuclear magnetic resonance (NMR) of nuclei, and the fact that when tissue nuclei are placed in the environment of a strong external magnetic field they will each assume a discrete energy state. When considered together, it is the statistical distribution of those energy states of the atomic nuclei in a magnetic field that leads to a macroscopic magnetic moment. Importantly for MRI, these nuclear magnetic moments react to a particular radio frequency (RF) radiation by specifically changing their orientations.

NMR takes advantage of the fact that while tissue nuclei are in an external magnetic field, induced changes in their energy states will generate signals which are characteristic of the tissue. In particular, with appropriate changes in orientation of the magnetic moments, it is possible to generate spin echo signals. Not surprisingly, many variables are involved in this process, and importantly, they are interrelated.

As indicated above, nuclei assume orientations in a magnetic field which may be subsequently changed by RF radiation. The RF radiation which is most effective for inducing such a change has a particular frequency which depends on the magnitude of the magnetic field at the location of the nucleus. This particular frequency, more familiarly known as the Larmor frequency, is equal to the angular frequency of precession of the nucleus spin vector about the direction of the magnetic field vector. Generally stated, it is necessary to irradiate nuclei with their particular Larmor frequency to induce rotations of the net magnetic moment vector. Particularly important to the present invention is the fact that RF pulses which cause one hundred and eighty degree (180°) rotations of the magnetic moment vectors are capable of generating spin echo signals by refocussing a large number of magnetic moments having a range of Larmor frequencies. This fact is of less importance when NMR is conventionally performed using nearly homogeneous fields and the range of Larmor frequencies is small. The present invention, however, is concerned with inhomogeneous magnetic fields wherein the range of Larmor frequencies may be quite large due to the use of a remotely positioned imaging device.

Unlike homogeneous magnetic fields, it is an inherent characteristic of inhomogeneous magnetic fields that they have a field strength gradient ($G_z$) which dominates the behavior of nuclei in the magnetic field. Insofar as MRI is concerned, there are three phenomena which can be directly attributed to the presence of a field strength gradient. For an effective MRI procedure, these phenomena must dealt with. They are: 1) the requirement for increased bandwidth in the RF radiation; 2) the fact that the nuclei will defocus immediately after being pulsed with the RF radiation; and 3) the tendency for defocussing nuclei to diffuse.

The requirement for an increased bandwidth of RF radiation arises because, in the presence of a field strength gradient, each nucleus will have a slightly different Larmor frequency. The consequence of this is that, as more nuclei are to be influenced during an MRI procedure, the bandwidth of the RF radiation must necessarily be broadened to include all of the required Larmor frequencies. It happens, a broadened bandwidth allows additional noise to pass. This lowers the signal-to-noise ratio (SNR) and makes detection of the spin echoes more uncertain.

Insofar as defocussing is concerned, it is well known that inmediately after the magnetic moments of nuclei in a magnetic field have been reoriented by a pulse of RF radiation, the field strength gradient ($G_z$) will cause the magnetic moments to begin defocussing. An adverse consequence of this is that as the nuclei defocus, they loose their coherence. The result is that the net magnetic moment is weakened and becomes less detectable. Consistent with the aforementioned wide range of Larmor frequencies, the time duration for this loss of coherence is significantly shortened in inhomogeneous field NMR. Correspondingly, the time to refocus a wider range of Larmor frequencies is also shortened.

Defocussing magnetic moments are also subject to diffusion. This is the well known random displacement of particles that occurs when there are variations in particle concentration.

With the difficulties imposed by the above stated phenomena, it has been recognized that a process of continually refocussing spin echoes at an accelerated rate is necessary for effective NMR in an inhomogeneous magnetic field. In particular, it has been recognized that by performing accelerated refocussing at a rate which is proportional to $G_z$, diffusion can be controlled and the SNR can be improved through the use of averaging techniques. For an example of a device which discloses and incorporates such a process, see U.S. application Ser. No. 08/012,053, filed on Feb. 1, 1993, for an invention entitled "Remote Positioned MRI System" which is assigned to the same assignee as the present invention and which is incorporated herein by reference.

As is well known, in order for an MRI system to make images, it must also incorporate an encoding procedure. This is required in order to generate the different patterns of net magnetic moments which can be later processed to create particular pixels for the resultant image. Typically, encoding is done by arbitrarily advancing or delaying the phases of the magnetic moments of the nuclei using x and y gradient pulses.

In Conventional homogeneous field MRI systems, well known combinations of phase encoding and frequency encoding are used. Techniques for encoding in inhomogeneous field MRI have also been disclosed in the art. For example, U.S. Pat. No. 4, 656,452, which issued to Bendel for an invention entitled "Method to Eliminate the Effects of Magnetic Field Inhomogeneity in NMR Imaging and Apparatus Therefor", describes a technique of interleaving gradient pulses within a pulse train of refocussed spin echoes. According to Bendel, this interleaving is accomplished in such a manner that the encoding patterns continue to accumulate while the defocussing caused by field inhomogeneities are refocussed. Bendel does not, however, specifically address the SNR and diffusion issues encountered when a remotely positioned device is used to generate an inhomogeneous field with a dominant $G_z$. Other difficulties with interleaved gradient pulses arise due to the wide ranges of Larmor frequency offset and RF amplitude offset. More specifically, within any coordinate system the nuclear magnetization will have an x component ($M_x$) and a y component ($M_y$). It is well known in the art that depending on the phase of the refocussing pulses, the contribution to the spin echo from one of these components of the nuclear magnetization may be lost. This problem is exacerbated when gradient pulses are interleaved within the refocussing pulse train as suggested by Bendel. This is so because each subsequent gradient further rotates magnetization components into the direction where they are not refocessed.

It has been recognized in the art that specific combinations of refocus pulse phases may be used in an attempt to preserve both components of the encoded magnetizations during the refocussing process. For example, in an article entitled "Modified Carr Purcell Meiboom Gill Sequence for NMR Fourier Imaging Applications" which appeared in the Journal of Magnetic Resonance, Vol. 69, pp. 488–489 (1986), Maudsley describes the use of a phase pattern for a group of four refocussing pulses. Further stabilization of both components of encoded magnetization is afforded by a different phase pattern used in groups of eight refocussing pulses, as described in the previously cited application No. 081,012,053. With this stabilization of both components, some of the gradient pulses may be selectively interleaved within a train of 180° refocussing pulses.

It is nevertheless recognized for the present invention that the ability of composite pulse patterns to fully refocus both components may still be impaired after large numbers of refocussing pulses, e.g. greater than one hundred pulses. It is further recognized, that since one of the components can be completely preserved over the course of hundreds of refocussing pulses, the entire pattern of encoded moments may be obtained by a two step procedure. In this two step procedure, first one component of magnetization for a given encode is preserved, and in the second step, the other component is preserved. It is appreciated that this is possible provided the gradient pulses are not interleaved within the refocussing pulse train, and the phase of the refocussing pulses is adjusted according to which component is to be preserved. To do this, it is also appreciated that each gradient encoding pattern must be imparted twice, once for each of the components that is preserved.

Despite the fact that two separate steps are required to obtain the complete measurement for a given encoding pattern, the proposed method nevertheless effectively allows a single encoded measurement to be obtained from thousands of accelerated refocussed spin echoes.

Some additional considerations which are pertinent to MRI procedures wherein inhomogeneous magnetic fields are used, should be noted. The time period during which the train of spin echoes are recorded is important and has an effect on the spin echo signals. Specifically, for a nuclei in a magnetic field there are two time periods which are characteristic of their magnetic moments. The first time period of interest is the time required for the nuclei to restore their equilibrium after they have been tilted by an initial 90° pulse. This time period ($T_1$), also commonly referred to as the spin-lattice time, is the time for longitudinal magnetization of the nuclei to be restored. The other time period of interest is the time over which components of the magnetic moments decay after they have been tilted. This second time period ($T_2$) is commonly referred to as the spin-spin relaxation time. $T_1$ is not equal to $T_2$. In many instances, $T_1$ is approximately one order of magnitude (10X) greater than $T_2$. The importance of $T_2$ for MRI is that the refocussing and recording of nuclear magnetic moments must be accomplished during $T_2$. However, the time for recording can be varied within the time period $T_2$ and, depending on how much of $T_2$ is taken to retrieve spin echo signals, the net magnetic moment measurement will be either $T_1$ weighted or $T_2$ weighted.

In light of the above, it is an object of the present invention to provide a method for maintaining encoded component coherence of nuclear magnetic moments in a material to be imaged in an inhomogeneous magnetic field when using a remotely positioned MRI device, which avoids intermixing the encoding function and the refocussing function. Another object of the present invention is to provide a two step method for maintaining encoded component coherence in a material to be imaged in an inhomogeneous magnetic field when using a remotely positioned MRI device, which uses only one type of 180° refocussing pulses during each step in order to preserve all of a same component of the encoded magnetic moment profile for recording spin echoes. Yet another object of the present invention is to provide for a two step method for maintaining encoded component coherence of a material to be imaged in an inhomogeneous magnetic field when using a remotely positioned MRI device which alternates the type of 180° pulses in sequential refocussing and recording episodes to obtain spin echoes for both the x and the y components of the magnetic moment. Still another object of the present invention is to provide for a two step method for maintaining encoded coherence of nuclei in a material to be imaged in an inhomogeneous magnetic field when using a remotely positioned MRI device, which permits variation in the duration of refocussing pulse train function in order to permit $T_1$ or $T_2$ weighted net magnetic moment measurements. Yet another object of the present invention is to provide a two step method for maintaining encoded coherence of nuclei in a material to be imaged in an inhomogeneous magnetic field when using a remotely positioned MRI device, which is easy to use, simple to implement, an comparatively cost effective.

SUMMARY OF THE INVENTION

In accordance with the present invention, a method for using a remotely positioned MRI device to image biological tissue requires that nuclei in the tissue material first be encoded. Then, in a completely separate stage of the procedure, the encoded nuclei are repetitively refocussed to generate the spin echo patterns that are necessary for imaging the tissue material. The separated encode and refocus steps are then repeated with a phase shift in the refocus pulses in order to obtain a complete measurement.

To perform the method of the present invention, an MRI device is remotely positioned next to the tissue material to be imaged. This positioning places the tissue material to be imaged within the inhomogeneous magnetic field of the MRI device. A 90° pulse is then used to tilt the nuclear magnetic moments of tissue in the image plane. As intended for the present invention, the image plane is a slice or layer of the material to be imaged.

Immediately after the nuclear magnetic moments in the image plane have been tilted by the 90° pulse, they are encoded with an x-gradient, a y-gradient, or a combination of the two. Following application of the this gradient encoding pulse, the dephasing caused by differing Larmor frequencies is repeatedly refocussed with 180° pulses at an accelerated rate. For example, consider the accelerated rate disclosed in U.S. patent application No. 08/012,053 discussed above. Depending on the phase of the 180° refocusing pulses, the spin echoes produced during this refocussing pulse data will result from one component of the encoded magnetization profile. These data are recorded and stored.

A subsequent 90° tilt pulse again introduces transverse nuclear magnetization which is subject to the same encoding pulse described above. The dephasing caused by differing Larmor frequencies is again refocussed by 180° pulses at the same rate. This time, however, the phase of the refocussing pulses is advanced or delayed by 90° (π/2) in order to obtain spin echo data from the magnetization component which was lost in the previous refocus pulse train.

In accordance with the present invention, the step of repetitively refocussing the nuclei to generate recordable spin echoes is accomplished using a train of 180° pulses. Specifically, the 180° pulses in a train are generated at a predetermined pulse repetition rate, and the duration of the train is established to be equal to, or less than, the spin-spin relaxation time of the nuclei ($T_2$). Furthermore, for the method of the present invention, each train includes a plurality of 180° pulses all having the same phase angle. Specifically, the phase angle of 180° pulses in a train may be either a first phase angle or a second phase angle, which differs from the first phase angle by π/2.

In accordance with the present invention, a recording sequence consists of two steps each of which include an encode function and a refocus/record function. In the first step in the recording sequence, as indicated above, the nuclei of the tissue material being imaged are first encoded and then repetitively refocussed by a train of 180° pulses Also after each 180° pulse in the train, the net magnetic moments (spin echoes) of the nuclei are recorded. More specifically, because the defocus and refocus time of the nuclei are the same, the recordation of spin echoes is accomplished approximately midway between pairs of 180° pulses. This is when the nuclei have their highest and most pronounced net magnetic moment.

In the second refocusing step of the recording sequence, the nuclei are again encoded with the same encode. This time, however, a train of 180° pulses having the second phase angle is used. The recordings obtained during the first and second refocussing steps are then combined to generate a pattern for the encoded nuclei which are in the slice of material to be imaged.

As an additional step for the present invention, a time delay, $t_d$, which is selectively determined according to the desires of the operator, may be taken after the initial 90° pulse tilt to enhance the encoding of the nuclei. However, whatever time $t_d$ may be, it is necessary to refocus the nuclei at $t_d$ because they have been continually defocussing in the interim since they were initially tilted by the 90° pulse. This refocussing is done with a 180° pulse. In some instances, it may be preferable to refocus the now-encoded nuclei at time $t_d$ with a composite 180° pulse. For purposes of the present invention, a composite 180° pulse includes a plurality of back-to-back 180° pulses that each have a special phase angle. In either case, once the initial 180° pulse is applied to refocus the nuclei, it is necessary to wait until time $2t_d$ when the nuclei will completely refocus, before beginning the refocus/record function. It will be appreciated that additional encoding can be accomplished during the second time period, $t_d$, following the initial 180° pulse. When an encode time delay is incorporated, the encoded nuclei are refocussed at time $2t_d$, before the step of repetitively refocussing the nuclei with more closely spaced single 180° pulses is initiated to generate recordable spin echoes for imaging.

In accordance with the present invention, a plurality of patterns are generated by repeating the basic steps of the method. With each repetition of a 1–2 recording sequence of trains, however, the encoding for the nuclei is changed slightly. Therefore, a plurality of different patterns are generated as the steps of the method of the present invention are repeated. The plurality of patterns are then combined using linear image reconstruction techniques, such as Fourier analysis techniques, to create an image of the slice of tissue material which had been subjected to the method of the present invention.

BRIEF DESCRIPTION OF THE DRAWINGS

The novel features of this invention, as well as the invention itself, both as to its structure and its operation will be best understood from the accompanying drawings, taken in conjunction with the accompanying description, in which similar reference characters refer to similar parts, and in which.

DESCRIPTION OF THE PREFERRED EMBODIMENTS

Figure 1:
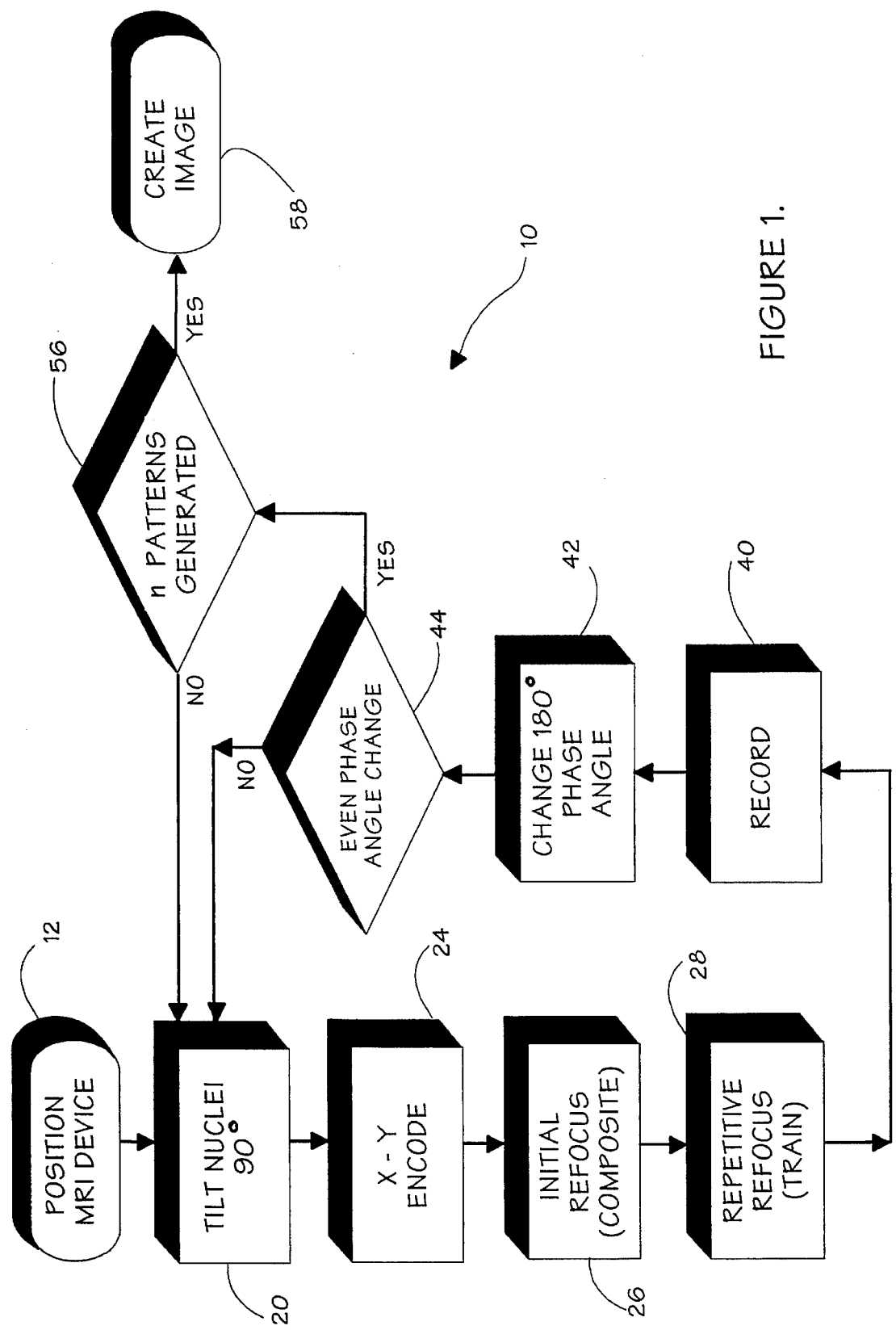
FIG. 1 is a block diagram flow chart of the procedural steps of the method of the present invention.

Referring initially to FIG. 1, a block diagram flow chart of the method of the present invention is shown and generally designated 10. As indicated by chart 10, the method of the present invention requires a prescribed sequence of steps be repeated many times with slight alteration in parameters between successive iterations of the sequences. Further, the method of the present invention requires that the results from each sequence of steps be eventually combined to create the desired MRI image. With this general overview in mind, the method of the present invention can be best appreciated by considering each sequential step individually in its relationship with the other steps of the method. From the chart 10 it will be seen that the first step taken for accomplishment of the method of the present invention is to place an MRI device adjacent the biological tissue to be imaged. This is indicated as step 12.

Figure 2:
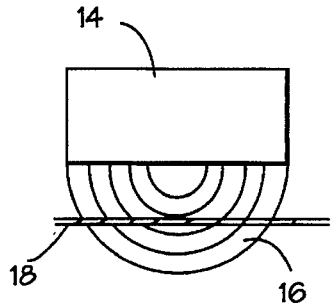
FIG. 2 is a schematic representation of a remote MRI device positioned adjacent a slice of tissue for imaging the tissue.

Referring for the moment to FIG. 2, it will be seen that in order to perform step 12 an MRI device 14 which generates an inhomogeneous magnetic field 16 needs to be positioned adjacent the slice of tissue 18 to be imaged. As intended for the present invention, slice 18 is preferably biological tissue. Slice 18, however, may be any material which is susceptible to the phenomena required to accomplish nuclear magnetic resonance imaging. As shown in chart 10 of FIG. 1, once the MRI device 14 has been properly positioned and activated, the next step in the method of the present invention is to tilt the nuclei in slice 18 with a 90° pulse as indicated by step 20. This tilting of the nuclei is accomplished in a manner well known in the pertinent art and is best appreciated with vector representations as shown in FIG. 3A.

Figure 3A:
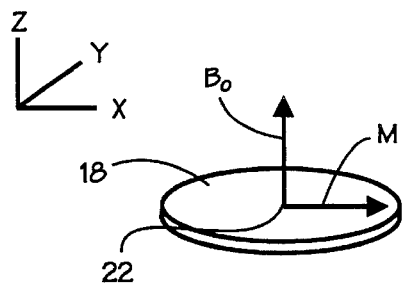
FIGS. 3A and 3B are, respectively, the representations of a magnetic moment vector after it is tilted by a 90° pulse and then encoded with x and y gradients.

In FIG. 3A, the magnetic field strength, $B_0$, in the vicinity of a location 22 in slice 18 is shown as a vector which is substantially parallel to the flux line of magnetic field 16 at the location 22. Initially, the net magnetic moment of nuclei at the location 22 will be aligned in the direction of $B_0$. After a 90° tilting pulse has been given, however, (see step 24) the net magnetic moments of the nuclei are tilted through an angle of 90° and they can then be substantially represented by the vector M, shown in FIG. 3A.

Figure 3B:
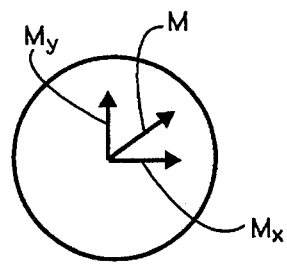

Step 24 in chart 10 of FIG. 1 indicates that after the nuclei have been tilted with the 90° pulse, the nuclei are to be encoded. This is done by subjecting the nuclei to x and y field gradients in a manner well known in the pertinent art. While it is to be appreciated that either the x gradient, or the y gradient, may be zero, generally there will be both x and y components for the net magnetic moment vector M which are greater than zero. For the general case shown in FIG. 3B, an encoded magnetic moment vector M is shown with both an x component, $M_x$, and a y component, $M_y$. It is to be appreciated that the representations shown in FIG. 3B are idealized and short lived. As indicated above, due to the field gradient, $G_z$, the nuclei will immediately begin to defocus after being tilted by the 90° pulse. Nevertheless, encoding with the x and y gradient can, and normally is, continued as the nuclei defocus.

For the reasons given above concerning defocussing and diffusion, and to reconstitute a net magnetic moment M which will generate spin echos which are recordable for MRI purposes, it is necessary to refocus the nuclei very soon after they have been initially tilted by the 90° pulse. Step 26 in chart 10 of FIG. 1 so indicates. For the present invention, a refocussing 180° pulse, of a type well known in the pertinent art, may be used for this purpose. Further, to enhance this refocussing of the nuclei while encoding is being accomplished, it may be desirable to use what is commonly referred to as a composite 180° pulse. Such a composite 180° pulse is actually a plurality of 180° pulses, some of which have a phase angle that is different from that of the other 180° pulses in the composite pulse. In any event, the 180° refocussing pulse which is imposed by step 24 causes the defocussing magnetic moments of the nuclei in the tissue slice 18 to refocus. Consequently, a net magnetic moment M is reconstituted which will generate the spin echos required for nuclear magnetic resonance imaging. Once the nuclei have been refocussed by the initial 180° refocussing pulse, additional encoding of the nuclei is no longer necessary. Once the nuclei are encoded, the method of the present invention is then directed toward repetitively refocussing the nuclei to generate a series of spin echos which can be used for MRI.

Figure 4:
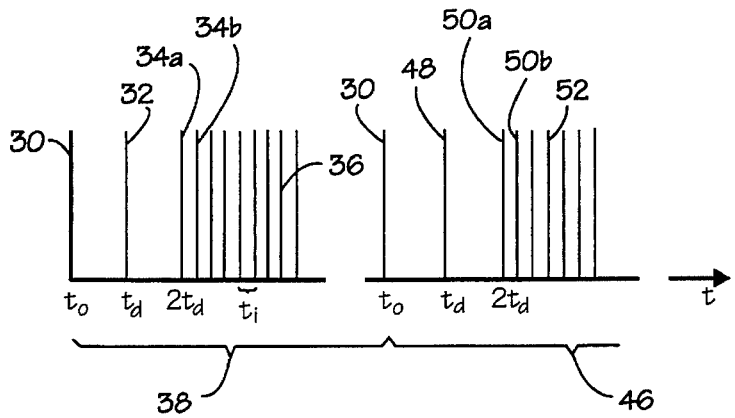
FIG. 4 is a time line representation of the tilting and refocussing pulses for a refocussing sequence in the method of the present invention.

The repetitive refocussing of nuclei, as indicated by step 28 in chart 10, is, perhaps, best appreciated by relating FIG. 4 to the steps 20, 24 and 26 discussed above. In FIG. 4 it will be seen that the pulsing of tissue slice 18 begins with a 90° tilting pulse 30 which is radiated at time $t_o$. The pulse 30 is then followed by the initial refocussing pulse 32 after a time delay of $t_d$, which can be selectively set by the user to ensure effective encoding of the nuclei. Recall, the x and y encoding will begin immediately after slice 18 has been radiated by tilting pulse 30. Further, as will be appreciated by the skilled artisan, x and y encoding can continue after radiation of slice 18 by the refocussing pulse 32. This additional encoding can be accomplished for a second time interval $t_d$ to give an effective encode time of $2t_d$.

After the nuclei have been refocussed at time $2t_d$, the nuclei are subjected to a series of 180° refocussing pulses 34a, 34b et seq. (sometimes referred to hereinafter as pulses 34). Collectively, the pulses 34 establish a train of 180° refocussing pulses 36. The time interval $t_i$ between consecutive pulses 34 in the train 36 can be set as desired by the user. Preferably, $t_i$ is in the range of from one to one hundred microseconds (1–100 μsecs). Further, during the application of pulse train 36, the pulses 34 in the train 36 need to be evenly spaced by the time interval $t_i$. Therefore, because the nuclei will refocus at $2t_d$ that the train 36 of pulses 34 should be initiated at a time $t_i/2$ after $2t_d$. Each pulse 34 thereafter will follow the previous pulse by a time interval $t_i$. Together, the tilting pulse 30, the initial refocussing pulse 32, and the train 36 of pulses 34 provide the pulses necessary for a recording sequence 38.

It is an important concept of the present invention that once a train 36 of pulses 34 has been initiated, there is no more encoding of the nuclei during the recording sequence 38. Stated differently, as nuclei are being refocussed by pulses 34 in train 36, there will be no encoding. This is so, because, it happens that with each x-y encode the net magnetic moment vector M is reduced to x and y components. Whichever one of these components is out-of-phase with subsequent refocussing pulses 34 will become lost. The consequence is that with repetitive x-y encodes, the net magnetic moment vector M will be unnecessarily diminished by the subsequent encodes. An initial encode, of course, is necessary and its consequences can be tolerated by the method of this invention. To thereafter preserve the moment component of interest, it is necessary that all pulses 34 of the train 36 have the same phase angle. This notion is best appreciated by cross-referencing FIG. 3B with FIGS. 5 A–D.

In FIG. 3B it will be seen that the net magnetic moment vector M, when encoded with x and y gradients, has an x component $M_x$ and a y component $M_y$. Both $M_x$ and $M_y$ result from the encoding step 24 which begins at $t_o$. As shown in FIG. 3B, $M_x$ and $M_y$ are, respectively, oriented along the x axis and the y axis. As indicated above, when the encoded nuclei are defocussing and are then refocussed by a 180° pulse, depending on the phase angle of the 180° pulse, either $M_x$ or $M_y$ is lost. For example, consider that the nuclei are radiated with a 180° pulse having a phase angle which preserves only the $M_x$ component. The result is the $M_x$ component is preserved and the $M_y$ component is lost. As also indicated above, any subsequent encoding will generate new $M_x$ and $M_y$ components and, when the nuclei are refocussed, the new $M_y$ component will become lost. As this process is repeated, each newly generated $M_y$ component will be lost with each refocussing and M will be diminished rather quickly.

To avoid the problem outlined above, once M has been encoded, one component of M is preserved for subsequent refocussing during the recording sequence 38. This is done, by refocussing the defocussing nuclei with only 180° pulses which have the same phase angle. Thus, if the x component of M is preserved with the initial 180° pulse 32, then $M_x$ will result when the nuclei refocus. And, as subsequent refocussing is accomplished with 180° pulses having the same phase angle, $M_x$ will continue to be periodically reconstituted. The only limitation being that $M_x$ will gradually diminish during the spin-spin relaxation time $T_2$.

Figure 5A:
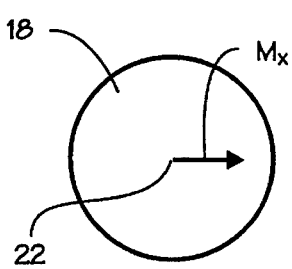
FIGS. 5A, B, C and D are, in sequence, representations of (FIG. 5A) focussed magnetic moment vector components, (FIG. 5B) defocussing vectors, (FIG. 5C) defocussed vectors after being irradiated with a 180° pulse having a first phase angle, and (FIG. 5D) refocussed magnetic moment vectors.
Figure 5B:
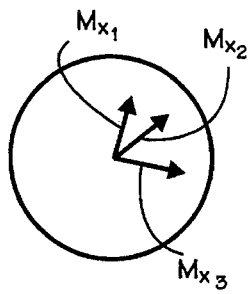
Figure 5C:
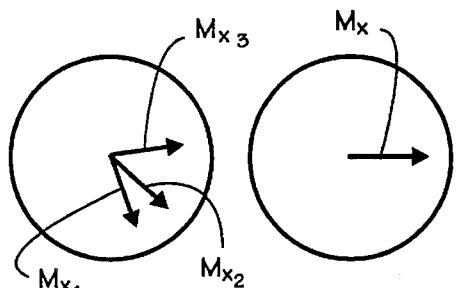
Figure 5D:
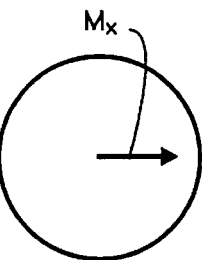

FIGS. 5A–D show a vectorial representation of the time sequence for the x components of the magnetic moment vectors as they defocus and are refocussed during a recording sequence 38. Specifically, to begin, FIG. 5A shows all nuclear magnetic moments aligned to establish $M_x$. As stated above, however, this is short lived. Due to the field gradient $G_z$ the nuclei will immediately begin to defocus and will assume incoherent relationships with each other. Such as the arrangement is shown for $M_{x1}$, $M_{x2}$, and $M_{x3}$ in FIG. 5B. When a 180° refocussing pulse is imposed on the moments in FIG. 5B, all will be simultaneously rotated 180° about the x axis. Accordingly, after this 180° refocussing pulse, at time $t_d$, $M_{x1}$, $M_{x2}$ and $M_{x3}$ will assume the arrangement shown in FIG. 5C. At this point they will begin to refocus to $M_x$ as shown in FIG. 5D. As indicated above, the y component of M is lost in the sequence. Importantly, it is when the net moment vectors $M_x$ are established that the spin echos are best received and recorded. Thus, because nuclei will defocus and refocus at the same rate, $M_x$ will be reconstituted midway between each successive pair of refocussing pulses 34, i.e. at time $t_i/2$. It is at those times during the recording sequence 38 ($t_i/2$) when $M_x$ has been refocussed that the spin echos are recorded. This function is shown as step 40 in chart 10. The actual recording can be performed during sequence 38 for as much of the spin-spin relaxation time $T_2$ as is desired by the user.

Chart 10 indicates that after the recording of spin echos during a recording sequence 38, the next step 42 is to change the phase angle of the 180° pulses. Recall that thus far there has only been one refocussing and sequence 38, and this has been for the $M_x$ component of M. A second component refocussing and recording routine to preserve the $M_y$ component can now be accomplished in the same manner disclosed above for the $M_x$ component. This is accomplished simply by changing the phase angle of the 180° refocussing pulses, Before proceeding with this second iteration, however, it should be noted that decision step 44 of chart 10 requires consideration be given to how many times the phase angle of 180° refocussing pulses has been changed. This consideration is given in order to properly sequence the phase angle changes of the refocussing pulses to alternatingly record spin echos for $M_x$ and $M_y$. At this time, and for the example being given, because only one refocussing and recording routine has been accomplished, there has also been only one (an odd number) phase angle change. Step 44, therefore, indicates the routine should be immediately repeated with the new phase angle. For this second iteration of the refocussing and recording routine, both the same tilting pulse 30 (step 20), and the same x and y encode gradients (step 24) are used. However, because of the phase angle change in the 180° refocussing pulses, the $M_y$ component will now be refocussed and recorded rather than the $M_x$ component.

Figure 6A:
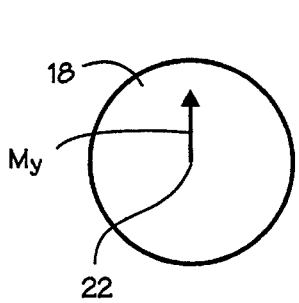
FIGS. 6A, B, C and D are, in sequence, representations of (FIG. 6A) focussed magnetic moment vector components, (FIG. 6B) defocussing vectors, (FIG. 6C) defocussed vectors after being irradiated with a 180° pulse having a second phase angle, and (FIG. 6D) refocussed magnetic moment vectors.
Figure 6B:
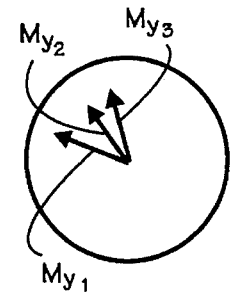
Figure 6C:
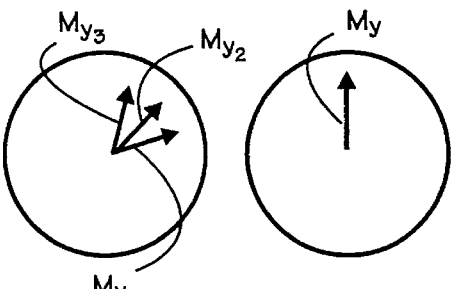
Figure 6D:
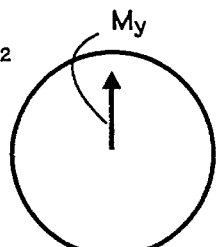

For this second iteration of the refocussing and recording procedure, reconsider chart 10 in FIG. 1, and cross reference chart 10 with the recording sequence 46 shown in FIG. 4. Concurrently, consider the time sequence of the vectorial representations for $M_y$ shown in FIGS. 6A–D. As before, a tilting pulse 30 is applied. Again, the x and y encode gradients are applied during a time delay $t_d$ immediately following the pulse 30. And again, at time $t_d$, an initial refocussing 180° pulse 48 is applied to refocus the defocussing nuclei. An additional time $t_d$ is again required after application of the refocussing pulse 48 for the nuclei to refocus and, as before, encoding can be accomplished during the second $t_d$ interval. As with the first iteration of the interval, at a time $t_i/2$ plus $2t_d$ after $t_o$, a 180° refocussing pulse is applied to the slice 18. Unlike the first iteration, however, the 180° refocussing pulse 50a used for the second iteration has a phase angle which is 90° from the phase angle of the refocussing pulses 34 in train 36. The result is that now only the y components of the moment vectors are preserved, and they will refocus to the $M_y$ component shown in FIG. 6A. Subsequent 180° pulses, i.e. pulse 50b et seq., which follow pulse 50a create a train 52 of the pulses 50 which all have the same phase angle and, thus, preserve $M_y$ through $T_2$. Accordingly, as the train 52 is applied and as before with $M_x$, midway in the time interval $t_i$ between pulses 50, the $M_y$ component is refocussed to present a recordable spin echo. Recordable $M_y$ are such as those shown in FIGS. 6A and 6D.

The situation with $M_y$ is very similar to that discussed above with regard to $M_x$ and FIGS. 5A–D. Like FIGS. 5A–D, FIGS. 6A–D depict representative arrangements of the moment vectors during a time interval $t_i$. At the beginning of the interval, $M_y$ is oriented on the y axis. As discussed above, $M_y$ will begin to immediately defocus. This is shown here by the arrangement of moment vectors $M_{y1}$, $M_{y2}$, and $My_3$ in FIG. 6B. At time $t_i/2$ a 180° refocussing pulse 50 with an appropriate phase angle is applied and the moment vectors $M_{y1}$, $M_{y2}$, and $My_3$ will simultaneously rotate about the y axis. As rotated, $M_{y1}$, $M_{y2}$, and $My_3$ then assume the arrangement shown in FIG. 6C. The moment vectors $M_{y1}$, $M_{y2}$, and $My_3$ will now stop defocussing and, instead, will refocus to the $M_y$ component shown in FIG. 6D and again begin defocussing. As with $M_x$ the process of refocussing $M_y$ is continued for as much of $T_2$ as is desired by the user and, each time a net magnetic moment $M_y$ is created, a recording of the spin echo is made.

After the $M_y$ component is repetitively refocussed by the train 52, and has been recorded, step 42 again is used to change the phase angle. This time the phase angle of the refocussing pulses is changed back to the phase angle used for the pulses 34 of pulse train 36 to preserve and record $M_x$. Also, at this time, there have now been two phase angle changes. Accordingly, step 44 indicates to proceed to step 56.

With $M_x$ and $M_y$ having been recorded for the same x and y gradient encode, step 56 of chart 10 indicates that the next consideration is whether n encodings have been generated. If not, step 56 directs that the process be repeated to generate another encoded measurement from the spin echos of new $M_x$ and $M_y$ components.

The method thus continues for an iteration. Consequently, after n different encodes, n different $M_x$ and $M_y$ components will have been generated and as indicated by Step 58 they are to be combined using well known linear image reconstruction techniques to generate the desired image of tissue in slice 18. For a standard image format, n will be sufficient to generate approximately a 256× 256 pixel matrix for the image. It is to be appreciated, however, that smaller images can be generated by the method of the present invention.

As indicated above, after the 90° tilting pulse has been applied, there is a time delay $t_d$ immediately following the tilting pulse during which the nuclei are encoded. This time delay $t_d$ will not normally be of the same duration as the time intervals $t_i$ between pulses in the trains 36, 52. Thus, as intended for the present invention, $t_d$ can be varied according to the needs of the user. Another aspect of the present invention which should be considered by the user when performing the method of the present invention, is the total length of time which is used for the recording sequences 38, 46. As stated above, the recording sequences 38 and 46 can be effective only during the spin-spin relaxation time $T_2$. Consequently, recording sequences 38 and 46 can not be longer than $T_2$. They can, however, be shorter. In fact, they can be varied. It happens that, as between the spin-spin relaxation time $T_2$ and the spin-lattice relaxation time $T_1$, the retrieved spin echo signals can be either $T_1$ or $T_2$ weighted. This will depend upon the particular characteristics of the tissue in slice 18 to be analyzed. Accordingly, the more of $T_2$ that is used for recovery of spin echo signals, the more the recorded signal will be $T_2$ weighted.

In an alternate embodiment of the present invention, rather than refocussing and recording with 180° pulses having one phase angle and then changing the phase angle of the 180° refocussing pulses for the next recording sequences, the x and y encoding for each recording sequence is changed. Stated differently, all recording sequences can use 180° refocussing pulses which have the same phase angle, if the x and y encoding gradients are changed between the recording sequences. Thus, in the preferred embodiment, the phase angle of the 180° refocussing pulses is changed 90° for each subsequent recording sequence, and in this alternate embodiment the phase angle of the x and y encoding gradients is changed 90° for each subsequent recording sequence.

While the particular METHOD FOR MAINTAINING ENCODED COHERENCE FOR REMOTELY POSITIONED MRI DEVICE as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

We claim:

1. A method for maintaining encoded component coherence of nuclear magnetic moments in a material to be imaged in an inhomogeneous magnetic field when using a remotely positioned MRI device, which comprises the steps of:

tilting said nuclear magnetic moments of said material with a 90° pulse;

encoding said tilted nuclei by imposing a gradient to said material, said gradient consisting of an x-gradient and a y-gradient;

repetitively refocussing said tilted nuclear magnetic moments with a train of 180° pulses, said train having a plurality of said 180° pulses and a predetermined pulse repetition rate; and recording the magnetic moment measurements of said refocussed nuclei after each 180° pulse in said train.

2. A method as recited in claim 1, said tilting, encoding, refocussing and recording steps comprise a recording sequence and said method further comprises the step of repeating said recording sequence.

3. A method as recited in claim 2 wherein said repeated recording sequences are characterized by sequentially alternating a first recording sequence with a second recording sequence.

4. A method as recited in claim 3 wherein said train in said first recording sequence includes a plurality of 180° pulses having a first phase angle.

5. A method as recited in claim 4 wherein said train in said second recording sequence includes a plurality of 180° pulses having a second phase angle.

6. A method as recited in claim 3 wherein said encoding of said nuclei in said first recording sequence has a first phase angle.

7. A method as recited in claim 6 wherein said encoding of said nuclei in said second recording sequence has a second phase angle.

8. A method as recited in claim 1 wherein said train has a duration and said duration of said train is less than the spin-spin relaxation time of said magnetic moments ($T_2$).

9. A method as recited in claim 8 wherein said duration is variable between a time period approximately equal to $T_2$ and a time period less than $T_2$.

10. A method as recited in claim 1 wherein said predetermined pulse repetition rate is approximately in the range of one to one hundred microseconds (1–100 μsec).

11. A method as recited in claim 1 wherein said recording step is accomplished at substantially the midpoint between successive 180° pulses in said train.

12. A method as recited in claim 1 further comprising the step of accomplishing said encoding step during a time delay ($t_d$) immediately following said tilting step.

13. A method as recited in claim 12 wherein said time delay ($t_d$) for encoding is greater than any time interval between successive 180° pulses in said train.

14. A method as recited in claim 13 further comprising the step of using a composite 180° pulse at the time $t_d$ to refocus said magnetic moments.

15. A method as recited in claim 14 wherein said encoding step includes encoding between use of said composite 180° pulse and the time $2t_d$.

16. A method as recited in claim 1 further comprising the steps of:

developing a pattern by combining said magnetic moment measurements recorded by each train of 180° pulses;

creating a plurality of said patterns; and combining said plurality of patterns to create an image.

17. A method for using a remotely positioned MRI device to image a material in an inhomogeneous magnetic field while maintaining encoded component coherence of nuclear magnetic moments in the material to be imaged, which comprises the steps of:

encoding nuclei of said material with a gradient, said gradient consisting of an x-gradient and a y-gradient;

pulsing said encoded material with a train of 180° pulses to generate a pattern of magnetic moments from said encoded nuclei;

sequentially repeating said encoding step and said pulsing step to generate a plurality of said patterns; and combining said plurality of patterns to create an image of said material.

18. A method as recited in claim 17 wherein said train of pulses has a predetermined pulse repetition rate approximately in the range of one to one hundred microseconds (1–100 μsec).

19. A method as recited in claim 18 wherein said train has a duration and said duration is variable between a period of time equal the spin-spin relaxation time of said magnetic moments of said nuclei ($T_2$) and a period of time less than the spin-spin relaxation time of said magnetic moments ($T_2$).

20. A method as recited in claim 17 wherein said pulsing step uses a plurality of first trains each said first train including a plurality of 180° pulses having a first phase angle, and a plurality of second trains each said second train including a plurality of 180° pulses having a second phase angle, and wherein each said first train is sequentially alternated with each said second train.

21. A method as recited in claim 17 further comprising the step of initially tilting of said nuclear magnetic moments in said material with a 90° pulse.

22. A method as recited in claim 17 wherein said encoding step further comprises the steps of:
encoding said nuclei during a time delay ($t_d$) immediately following said tilting step;
using a composite 180° pulse at the time $t_d$ to refocus said nuclei; and
initiating said repetitive refocussing step at the time $2t_d$.

23. A method as recited in claim 21 wherein said encoding step includes encoding during the time interval between $t_d$ and the time $2t_d$.

24. A method as recited in claim 21 wherein said composite 180° pulse is a plurality of back-to-back 180° pulses, and each of said back-to-back 180° pulses has a special phase angle different from said phase angle of at least one other said back-to-back 180° pulses.

25. A method as recited in claim 17 wherein said combining step is accomplished using a linear image reconstruction technique.

* * * * *